United States Patent [19]

Chatterjee et al.

[11] 4,272,303
[45] Jun. 9, 1981

[54] METHOD OF MAKING POST-METAL ION BEAM PROGRAMMABLE MOS READ ONLY MEMORY

[75] Inventors: Pallab K. Chatterjee, Dallas; Al F. Tasch, Jr., Richardson, both of Tex.

[73] Assignee: Texas Instruments Incorporated, Dallas, Tex.

[21] Appl. No.: 68,841

[22] Filed: Jul. 9, 1979

Related U.S. Application Data

[63] Continuation of Ser. No. 912,635, Jun. 5, 1978, abandoned.

[51] Int. Cl.³ .................... H01L 21/265; B01J 17/00
[52] U.S. Cl. .................................. 148/1.5; 148/187; 357/23; 357/91
[58] Field of Search .................. 148/1.5, 187; 357/23, 357/91

[56] References Cited

U.S. PATENT DOCUMENTS

| | | | |
|---|---|---|---|
| 3,852,120 | 12/1974 | Johnson et al. | 148/1.5 |
| 3,861,651 | 2/1975 | Arita | 148/187 |
| 3,914,855 | 10/1974 | Cheney et al. | 29/571 |
| 4,059,826 | 11/1977 | Rogers | 365/104 |
| 4,129,936 | 12/1978 | Takei | 29/571 |
| 4,159,561 | 7/1979 | Dingwall | 29/571 |

*Primary Examiner*—L. Dewayne Rutledge
*Assistant Examiner*—Upendra Roy
*Attorney, Agent, or Firm*—William E. Hiller; Melvin Sharp; James T. Comfort

[57] ABSTRACT

An MOS read only memory, or ROM, is formed by a process compatible with standard P-channel or N-channel metal or silicon gate manufacturing methods. The ROM is programmed either after the protective nitride layer has been applied and patterned, usually the last step in the slice processing method before electrical testing of the devices, or after the electrical testing of the devices. All potential MOS transistors in the ROM array are initially at a logic "0" or a logic "1". Selected transistors are programmed by implanting a "light" ion such as hydrogen or helium through the protective nitride layer and the electrode into the gate oxide, photoresist being used as an implant mask.

17 Claims, 4 Drawing Figures

METHOD OF MAKING POST-METAL ION BEAM PROGRAMMABLE MOS READ ONLY MEMORY

This is a continuation of application Ser. No. 912,635 filed June 5, 1978, abandoned.

This invention relates to semiconductor memory devices, and more particularly to MOS read only memories and a process for making them.

Semiconductor memory devices are widely used in the manufacture of digital equipment such as minicomputers and microprocessor systems. Storage of fixed programs is usually provided in these systems by MOS read only memory devices or "ROMs". ROMs are made by semiconductor manufacturers on special order, the programming code being specified by the customer. The manufacturing process is lengthy, requiring dozens of steps, each taking up time and introducing materials handling and inventory factors. Customers require the turn-around time or cycle time between receipt of the ROM code for a custom order and delivery of finished parts to be kept as short as possible. For this reason, programming should be done late in the manufacturing process, but previous ways of doing this required large cell size. The economics of manufacture of ROMs, and of mounting them on circuit boards in the system, are such that the number of memory bits per semiconductor chip is advantageously as high as possible. ROMs of up to 32K bits (32,768) are typical at present. Within a few years, standard sizes will progress through 64K, 128K, 256K and 1 megabit. This dictates that cell size for the storage cells of the ROM be quite small. Metal gate ROMs of small size can be relatively easily fabricated in the manner set forth in U.S. Pat. No. 3,541,543, assigned to Texas Instruments, but usually these are programmed by the gate level mask which is at an early stage in the process. A method of programming a ROM by ion implant prior to forming the polysilicon gate is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip. And more recently post metal programmable ROMs have been disclosed in pending applications, Ser. No. 890,555, filed Mar. 20, 1978, by C-K Kuo, Ser. No. 912,774, filed June 5, 1978, by Chatterjee and Tasch, and Ser. No. 912,775 filed June 5, 1978, by Chatterjee and Tasch, all assigned to Texas Instruments.

It is the principal object of this invention to provide a method for programming MOS ROMs after the completion of the slice manufacturing process.

SUMMARY OF THE INVENTION

In accordance with an embodiment of the invention a method is provided for the programming of MOS read only memories or MOS ROMs, after the completion of the slice manufacturing process. The ROM is formed in an integrated circuit along with other transistors for the peripheral circuitry. The devices are fabricated in the conventional manner with all transistors in the ROM array at a logic "1" or a logic "0" depending on whether they are N-channel or P-channel. After the completion of the slice manufacturing process, and perhaps after slice testing, selected transistors are programmed by implanting a "light" ion such as hydrogen or helium through the protective nitride and the gate electrode into the gate oxide, photoresist being used as the implant mask.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
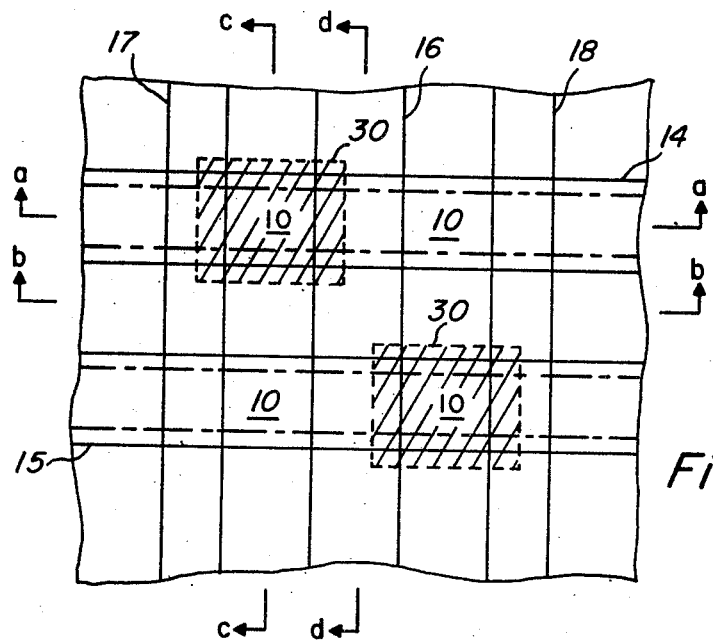
FIG. 1 is a greatly enlarged plan view of a small portion of a semiconductor chip showing the physical layout of a part of a ROM array made according to the invention.
Figure 2:
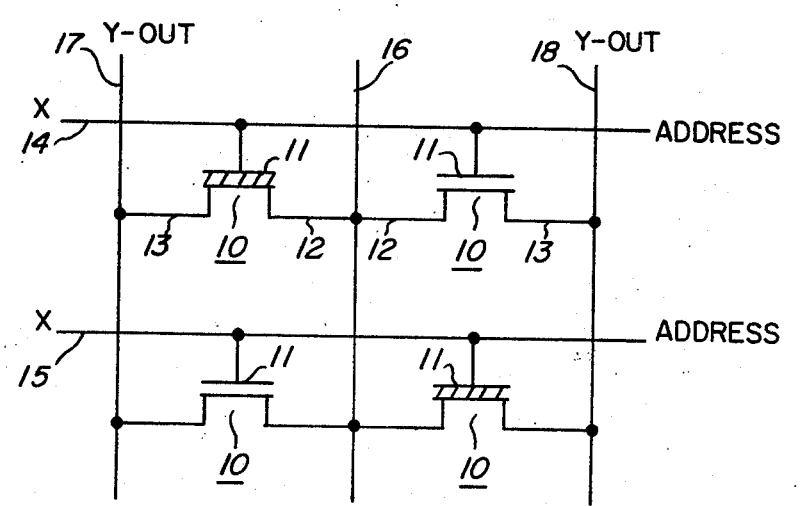
FIG. 2 is an electrical schematic diagram of the ROM of FIG. 1.
Figure 3A:
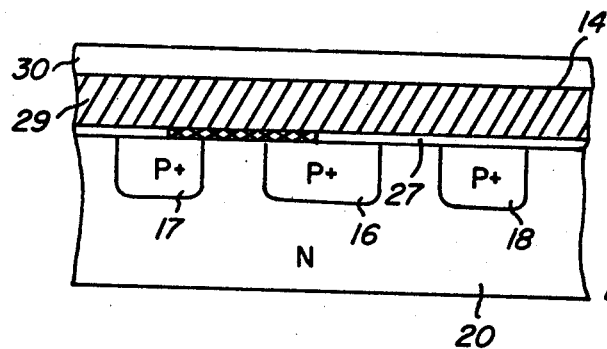
FIGS. 3a–3d are elevation views in section of the cell of FIG. 1, taken along the lines a—a, b—b, c—c, and d—d, respectively.
Figure 3B:
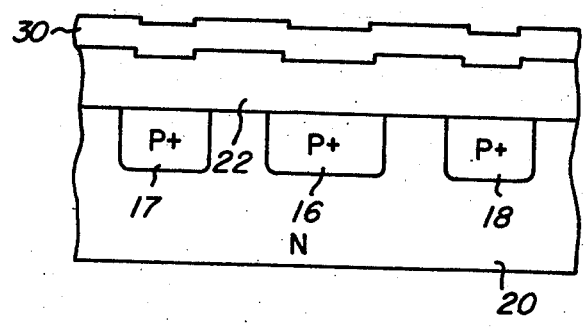
Figure 3C:
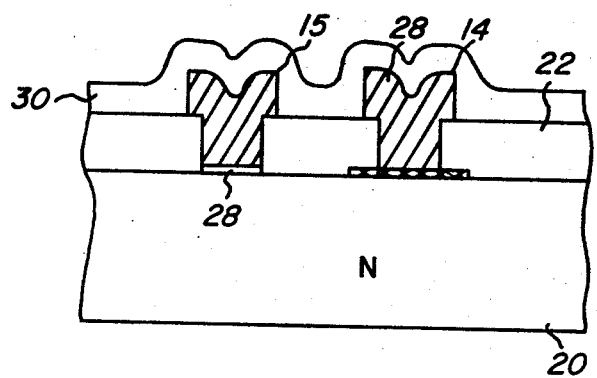
Figure 3D:
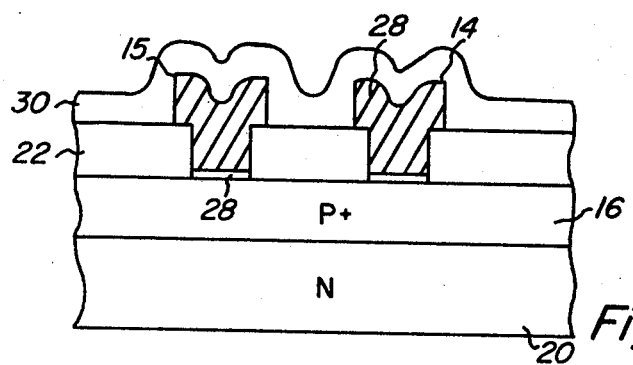

With reference to FIGS. 1, 2, and 3a–3d, a read only memory is illustrated which is programmed according to the invention. The array consists of a large number of cells 10, only four of which are shown. Each cell is an MOS transistor having a gate electrode 11, a source 12 and a drain 13. The gates 11 are parts of aluminum strips 14 and 15 which are the X address lines for the array. The sources are part of a P+ diffused region 16 which is connected to ground or Vss, while the drains are part of P+ diffused regions 17 and 18 which are Y output lines. The array, formed on a silicon bar 20, would typically contain perhaps 64K, 128K or 256K cells, so the bar would be less than about 200 mils on a side or 40,000 sq. mil area depending upon the bit density. The four cells 10 shown would be on a minute part of the bar, perhaps one or two mils wide. It should be kept in mind when examining the section views that not all geometries, junction depths and layer thicknesses are necessarily to scale, some having been enlarged or reduced where necessary to reflect features of the invention.

The cell array is programmed by implanting a light ion such as hydrogen or helium through the protective nitride 30, through the metal strips 14, 15 and into the gate oxide. The exposure of the gates to the ions will damage the oxide and oxide-silicon interface, causing an increase in the positive charge at the interface, and thereby raising the transistor threshold voltage to a value above that which will be applied on the selected address lines 14, 15. In the example of the four cells shown, the upper left cell and the lower right cell are exposed in this manner, the other two are not. A photoresist mask is used to prevent the ions from penetrating areas where they are not desired.

Turning now to FIGS. 4a–4f, a process for making the ROM array of the invention will be described. The starting material is a slice of N-type monocrystalline silicon, typically 3 inches in diameter and twenty mils thick, cut on the <111> plane, of a resistivity of about 3–5 ohms-cm. As above, in the Figures the portions shown of the bar 20 represent only a very small part of the slice, perhaps 1 or 2 mils wide for each part. After appropriate cleaning, the slice is oxidized by exposing to steam in a furnace at an elevated temperature of perhaps 1000 degrees C. to produce an oxide layer 22 of about 3000 Angstroms.

Next a layer 23 of photoresist is applied to the entire top surface of the slice, then exposed to ultraviolet light through a mask which defines the source and drain areas, and developed. This leaves areas 24 where the oxide layer 22 is to be etched away. The slice is subjected to an oxide etchant, such as hydrofluoric acid, which removes the oxide in the exposed area but does not etch the silicon 20 and does not attack the photoresist 23. At this point in the process the slice is represented by the section view in FIG. 4a.

Figure 4A:
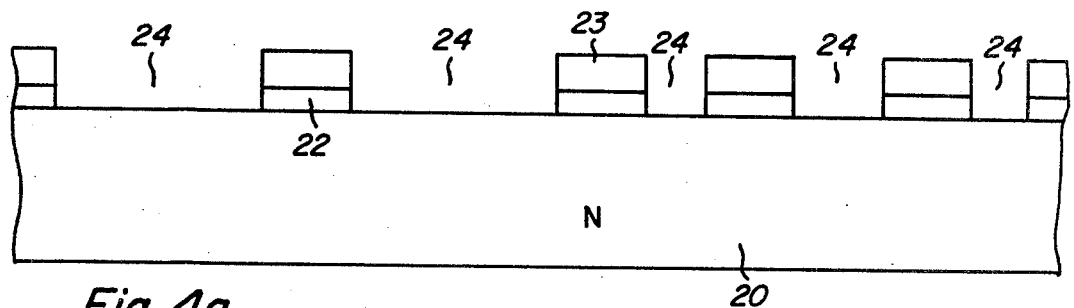
FIGS. 4a–4f are elevation views in section of the ROM array and a transistor in the peripheral part of the semiconductor device of FIGS. 1 and 3a–3d, at successive stages in the manufacturing progress, taken generally along the line a—a in FIG. 1.
Figure 4B:
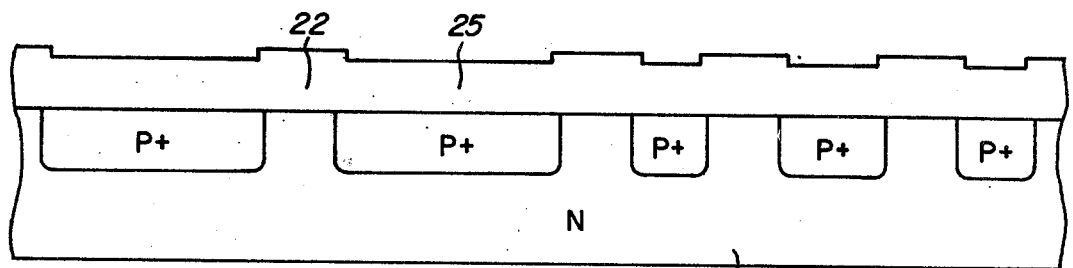

After the photoresist is removed the slice is subjected to a high temperature furnace operation whereby boron is "deposited" in a surface adjacent region in the source and drain areas. The furnace temperature is about 1075 degrees C. and the slice remains in the doping ambient for about 15 minutes. This is a standard gas deposition technique used throughout the semiconductor industry. The "deposited" layer has a resistance of about 8 ohms per square. Ohms per square is a well known term used to designate the resistance of shallow, uniformly doped semiconductor layers. The excess deposited material is removed by exposing the slices to dilute hydrofluoric acid. The next step is the diffusion of the "deposited" impurities further into the slice. At the same time there is an increase in the thickness of the original oxide 22 which covers the field and the growth of an oxide layer 25 over the source and drain areas. This is done by subjecting the slices to steam or an oxidizing atmosphere at about 900 degrees C. for perhaps 16 hours. The thickness of the field oxide layer 22 is about 12,000–13,000 Angstroms and the thickness of the oxide 25 over the source and drain areas is about 500 Angstroms less. The thick oxide is used to increase the field threshold voltage to a value greater than the device supply voltage. FIG. 4b shows the slice at this point in the process.

Figure 4C:
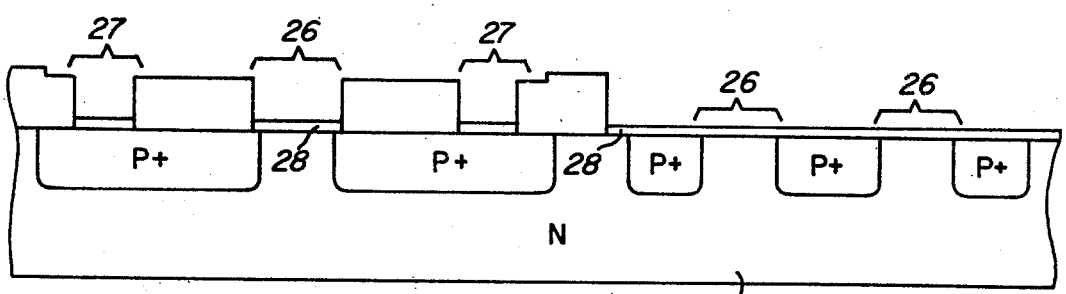

The next stage in the process is the creation of the gate areas 26 and the areas 27 which are to become the source and drain contacts. A photoresist coating is applied over the entire slice and exposed to ultraviolet light through a mask which defines the gate areas of all the transistors and the contact areas of those sources and drains which have them. Upon developing, unexposed photoresist is removed from the areas where the gates and the contacts are to be formed. The slice is next subjected to hydrofluoric acid which etches away the oxide layer 22 where it is not covered by photoresist, but does not etch the silicon or attack the photoresist. The photoresist is then removed and the slice is subjected to an oxidizing ambient at about 950 degrees C. for perhaps 15 minutes to grow the gate oxide layer 28. The thickness of the gate oxide layer is about 850–950 Angstroms. The slice is next subjected to a phosphorus stabilization step for about 15 minutes at 900 degrees C., leaving the slice as shown in FIG. 4c.

The next stage of the process is the formation of the contacts on those source and drain areas which have them. In the previous step the contact windows were defined but gate oxide was thereafter grown in them. In this step the gate oxide 28 is removed from these windows. A layer of photoresist is applied over the entire slice and exposed to ultraviolet light through a mask which exposes everything except those areas which are to become contacts. Upon developing, unexposed photoresist is removed from the areas where the contacts are created. The windows in the photoresist are actually 0.10 mil larger on each side than the actual contact size so the alignment here is not critical. The oxide layer which is not covered with photoresist is removed by etching the slice in hydrofluoric acid. The slice is etched just long enough to clear the gate oxide from the contact windows, and because of the oversized resist patterns actually creates an extra step in the oxide adjacent to the contacts. See FIG. 4d. Note that there are no source and drain contacts in the ROM cells.

The next stage of the normal fabrication process is the deposition, definition and sinter of the metal interconnects. The first step here involves the deposition of an aluminum layer 29 on the slice by use of a metal evaporator to a thickness of approximately 7500 Angstroms. The slice is next covered by a photoresist coating which is applied over the entire slice, then exposed to ultraviolet through a mask which exposes the areas that are to become the metal leads. Upon developing, unexposed photoresist is removed leaving photoresist where the leads are to be formed. The slice is then subject to an aluminum etch such as phosphoric acid which removes the aluminum layer 29 in all areas which are not covered by photoresist, but not attacking the silicon oxide 22, 28 or the photoresist. Upon removal of the photoresist the slice is annealed in nitrogen at about 450 degrees C. for perhaps 30 minutes.

Figure 4D:
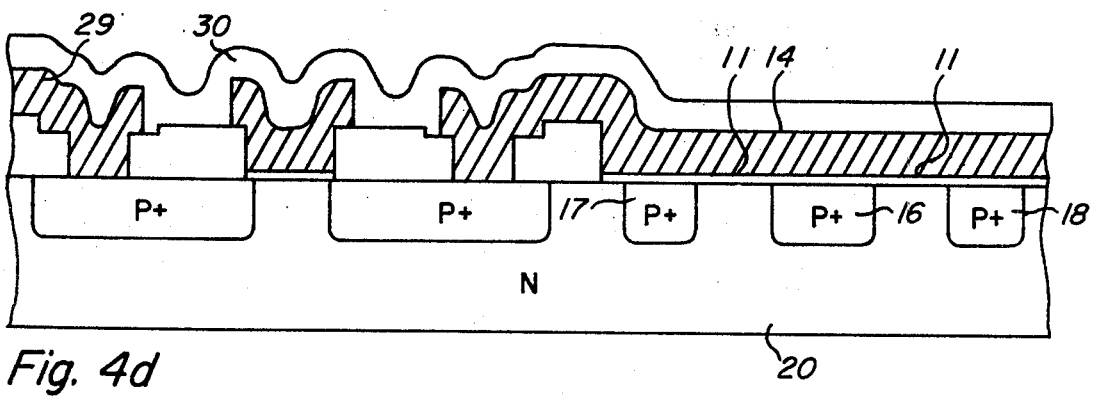

The last stage of the normal fabrication process is the definition and patterning of the protective nitride layer. A layer 30 of silicon nitride of about 3000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the openings over the bonding pads. Upon developing, unexposed photoresist is removed from areas above the bonding pads. The slice is then placed in an rf plasma reactor which removes the nitride which is not covered by photoresist, but does not remove the photoresist or attack the aluminum. The photoresist is then removed leaving the slice as shown in FIG. 4d. As previously mentioned this step terminates the normal slice fabrication process.

Figure 4E:
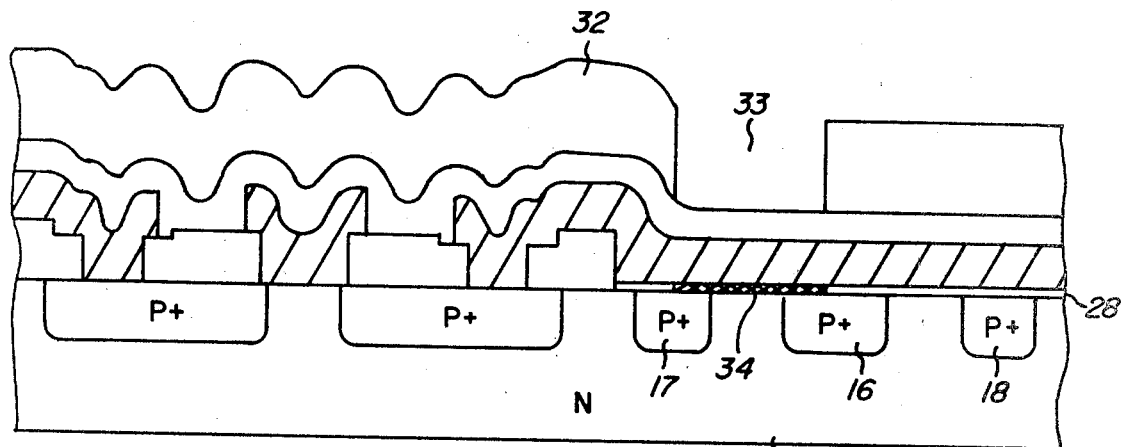
Figure 4F:
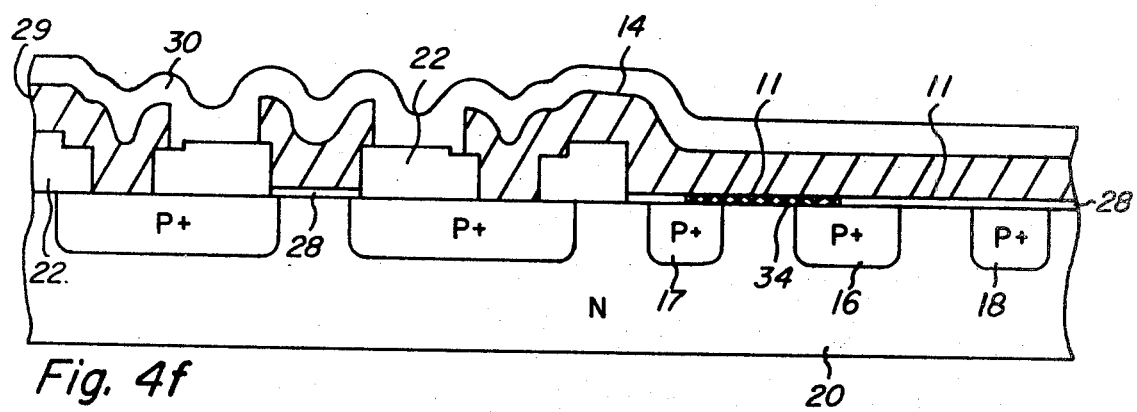

The following steps are the subject matter of the invention. It is at this point that the programming of the ROM is accomplished. The slice is covered with photoresist 32 and exposed to ultraviolet light through a mask which defines the ROM code. Upon developing, resist is removed from areas 33 where the implant is desired. The slice is then subjected to a hydrogen implant at about 65 KEV to a dosage of perhaps $5 \times 10^{14}$ per sq. cm creating the interface charge 34 and leaving the slice as shown in FIG. 4e. The energy level and dose depend upon the thickness of the protective nitride, the thickness of the metal leads, and the desired change in the threshold voltage since the ions are implanted into the gate oxide layer 28. The photoresist mask is removed from the slice leaving it as in FIG. 4f.

The exposure of the transistor gates to the ion beam has the effect of increasing the amount of positive silicon oxide-silicon interface charge and thereby increasing the threshold voltage of the exposed transistor. The amount of threshold voltage increase depends on the amount of charge per unit area that bombards the gate. FIG. 4e depicts how the slice would appear after the ion beam exposure, the cross hatched area representing the increased interface charge. It should be noted that the ions must penetrate the protective nitride layer and aluminum gate because the devices are already past the metal removal step when the ROM coding is performed. This ability to penetrate the metal gate is what makes programming possible at this point in the process. The oxide charge induced by this technique can be removed if the slice is subjected to substantial heat treatments. Therefore it is necessary to minimize the amount of heat exposure the slice sees after the programming step. A multilayer gate structure such as silicon-nitride on silicon oxide could be used instead of the oxide gate to essentially eliminate this problem, because the charge trapped at the oxide-nitride interface is not easily removed.

The advantage of such a procedure is quite significant. One is allowed to finish the conventional slice processing and store the slices while awaiting a customer order. Once the order is received the particular ROM code desired by the customer could be exposed on the slices and then the remainder of the processing could be completed. This is to be compared with the normal procedure of starting slices into the fabrication process upon receipt of an order. The amount of delay between receipt and shipping of an order is significantly reduced. It is also possible to electrically test the slices before programming. This is important since it would allow a very accurate inventory of the number of good electrical chips on the slices. This accurate inventory is very important for production planning purposes.

Although this invention has been described with reference to a P-channel metal gate MOS device, this technique could be used on P-channel silicon gate MOS devices, or with N-channel metal or silicon gate MOS devices. Only the dose and energy would need to be changed for the P-channel silicon gate. With the N-channel devices however, the procedure would have to be altered. With either P-channel or N-channel devices the effect of the exposure of the gate to the ion beam is the same; that is there is an increase in the amount of positive interface charge. This charge increase raises the threshold voltage of P-channel transistors but lowers the threshold voltage of N-channel transistors. Therefore on N-channel devices all the transistors would have to be fabricated with high threshold voltages and the transistors that need low threshold voltages would have to have their gates exposed to the ion beam. In effect the transistor gates that are exposed on P-channel devices are not exposed on the N-channel devices. This is a more difficult procedure since the exposure intensity would have to be tightly controlled when programming N-channel devices.

What is claimed is:

1. A method of making a read-only-memory comprising the steps of:
   forming a plurality of insulated gate field effect transistors in the face of a semiconductor body, each of the transistors having spaced source and drain regions, a channel between the source and drain regions, a gate oxide layer overlying the channel between the source and drain regions, and a gate electrode overlying the gate oxide, the transistors being in a regular pattern to provide an array of memory cells;
   subsequent to the completion of fabrication processing involving the formation of the array of memory cells, ion implanting particular memory cells by directing ions of sufficient energy to directly penetrate through the material of the gate electrode and into the gate oxide of selected memory cells; and
   programming the array of memory cells by altering the electrical characteristics of said particular memory cells in response to the selective ion implantation of said particular memory cells.

2. A method according to claim 1 further including forming a plurality of other transistors and a plurality of contacts and interconnections on the face of said semiconductor body peripheral to the array, employing a mask comprising a patterned coating of photoresist through which an ion beam is directed in selectively ion implanting the cells in accomplishing programming of the array of memory cells, and wherein the programming occurs after said contacts and interconnections have been formed.

3. A method according to claim 2 wherein the field effect transistors and the other transistors are P-channel metal gate transistors.

4. A method according to claim 2, wherein the field effect transistors and the other transistors are P-channel silicon gate transistors, and the forming of contacts and interconnections peripheral to the array is accomplished by depositing metal in a thin film and patterning the metal film.

5. A method according to claim 1 wherein the step of programming by ion implant produces trapping centers in the oxide.

6. A method according to claim 1 further including forming a plurality of other transistors and a plurality of contacts and interconnections on the face of said semiconductor body peripheral to the array, employing a mask comprising a patterned coating of photoresist through which an ion beam is directed in selectively ion implanting the cells in accomplishing programming of the array of memory cells and including implanting through the gate electrodes and into the gate oxide of said plurality of other transistors, and wherein the programming occurs after said contacts and interconnections have been formed.

7. A method according to claim 2 wherein the field effect transistors and the other transistors are N-channel silicon gate transistors, and the forming of said contacts and interconnections peripheral to the array is accomplished by depositing metal in a thin film and patterning the thin metal film.

8. A method according to claim 2 wherein the field effect transistors and other transistors are N-channel metal gate transistors.

9. In a method of making a read-only-memory which includes the steps of:
   forming a plurality of insulated gate field effect transistors in the face of a semiconductor body, each of the transistors having spaced source and drain regions, a channel between the source and drain regions, a gate oxide layer overlying the channel between the source and drain regions, and a gate electrode overlying the gate oxide, the transistors being in a regular pattern to provide an array of memory cells;
   forming a plurality of other transistors and a plurality of contacts and interconnections on said face of said semiconductor body peripheral to the array;
   the improvement comprising: ion implanting particular memory cells by directing ions of sufficient energy to directly penetrate through the material of the gate electrode and into the gate oxide of selected memory cells using a mask applied after said contacts and interconnections have been formed; and programming the array of memory cells by altering the electrical characteristics of said particular memory cells in response to the selective ion implantation of said particular memory cells.

10. In a method according to claim 9, wherein the field effect transistors and the other transistors are P-channel metal gate transistors.

11. In a method according to claim 9, wherein the field effect transistors and the other transistors are P-channel silicon gate transistors, and the formation of at least some of the contacts and interconnections is accomplished by depositing metal in a thin film and patterning the metal film.

12. In a method according to claim 9, wherein the step of programming includes ion implanting through the gate electrodes and into the gate oxide of said plurality of other transistors.

13. In a method according to claim 12, wherein the field effect transistors and the other transistors are N-channel silicon gate transistors, and the formation of at least some of the contacts and interconnections is accomplished by depositing metal in a thin film and patterning the metal film.

14. In a method according to claim 9, wherein the field effect transistors and other transistors are N-channel metal gate transistors.

15. A method of making a read-only-memory from an array of memory cells formed by a plurality of insulated gate field effect transistors provided in the surface of a semiconductor body, wherein each of the transistors includes a source, a drain, a gate electrode, and a gate oxide beneath the gate electrode and extending between the source and drain, said method comprising:

ion implanting particular memory cells by directing ions of sufficient energy to directly penetrate through the material of the gate electrode and into the gate oxide of selected memory cells, and programming the array of memory cells by altering the electrical characteristics of said particular memory cells in response to the selective ion implantation of said particular memory cells.

16. A method according to claim 15 wherein the ion implantation of particular memory cells is carried out by implanting ions into the gate electrode of each selected memory cell and to a depth at least into the gate oxide, and inducing a charge in the respective gate oxides of each selected memory cell in response to the implantation of ions thereinto.

17. A method of making a read-only-memory from an array of memory cells formed by a plurality of insulated gate field effect transistors provided in the surface of a semiconductor body, wherein each of the transistors includes a source, a drain, a gate electrode, and a gate oxide beneath the gate electrode and extending between the source and drain, said method comprising:

ion implanting particular memory cells by directing ions selected from the group consisting of hydrogen and helium of sufficient energy to directly penetrate through the material of the gate electrode and to a depth at least into the gate oxide of each selected memory cell but extending no deeper than the interface between the gate oxide and the semiconductor body; and programming the array of memory cells by altering the electrical characteristics of said particular memory cells in response to the selective ion implantation of said particular memory cells.

* * * * *